(12) United States Patent
Vogley

(10) Patent No.: US 6,583,639 B1
(45) Date of Patent: *Jun. 24, 2003

(54) REDUCED COST, HIGH SPEED CIRCUIT TEST ARRANGEMENT

(75) Inventor: Wilbur C. Vogley, Missouri City, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 31 days.

(21) Appl. No.: 09/633,305

(22) Filed: Aug. 8, 2000

Related U.S. Application Data

(62) Division of application No. 09/309,544, filed on May 11, 1999, now Pat. No. 6,114,870, which is a division of application No. 08/726,884, filed on Oct. 4, 1996, now Pat. No. 5,907,247.

(51) Int. Cl.[7] ............................................. G01R 31/26
(52) U.S. Cl. ...................................... 324/765; 324/755
(58) Field of Search ............................... 324/754, 755, 324/761, 762, 763, 765; 702/117–126; 714/718, 724, 725, 726, 727, 730, 734, 738, 740, 742, 743

(56) References Cited

U.S. PATENT DOCUMENTS

| | | | | |
|---|---|---|---|---|
| 4,455,654 A | * | 6/1984 | Bhaskar et al. | 714/28 |
| 4,873,705 A | * | 10/1989 | Johnson | 714/719 |
| 4,967,142 A | * | 10/1990 | Sauerwald et al. | 324/73.1 |
| 5,070,297 A | * | 12/1991 | Kwon et al. | 324/754 |
| 5,357,621 A | * | 10/1994 | Cox | 395/400 |
| 5,442,282 A | * | 8/1995 | Rostoker et al. | 324/158.1 |
| 5,497,079 A | * | 3/1996 | Yamada et al. | 324/158.1 |
| 5,532,610 A | * | 7/1996 | Tsujide et al. | 324/757 |

* cited by examiner

Primary Examiner—Kamand Cuneo
Assistant Examiner—Russell M. Kobert
(74) Attorney, Agent, or Firm—Frederick J. Telecky, Jr.; W. James Brady, III

(57) ABSTRACT

An integrated circuit device test arrangement includes a plurality of microcomputers. Each of the microcomputers is interconnected directly through a separate test socket to a separate integrated circuit device that is inserted into the test socket. A device tester is coupled to the plurality of microcomputers for transmitting information between the device tester and the plurality of microcomputers. Each microcomputer contains instructions and data for performing a test routine on the associated integrated circuit device and transmitting selected results of the test routine to the tester.

18 Claims, 4 Drawing Sheets

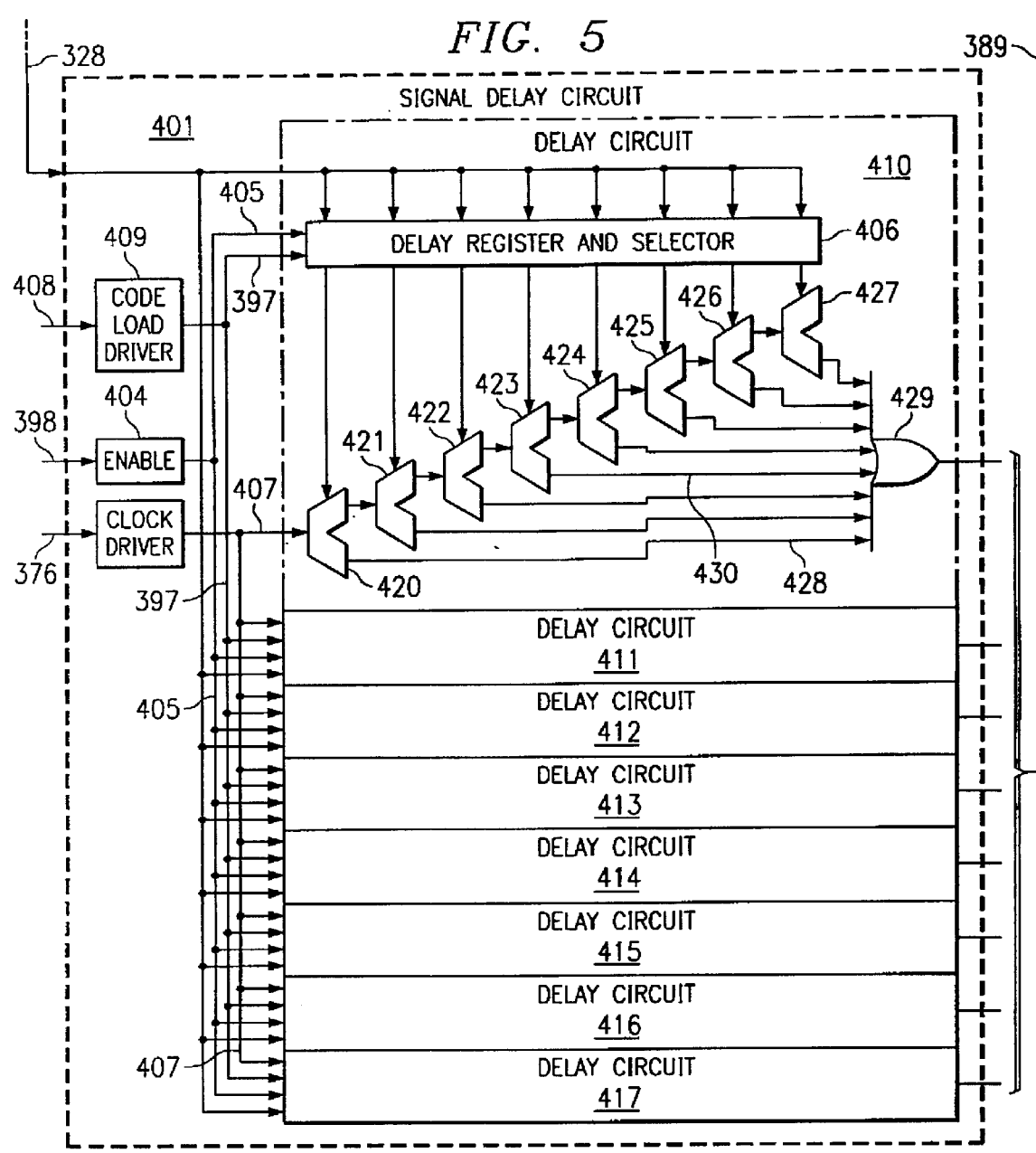
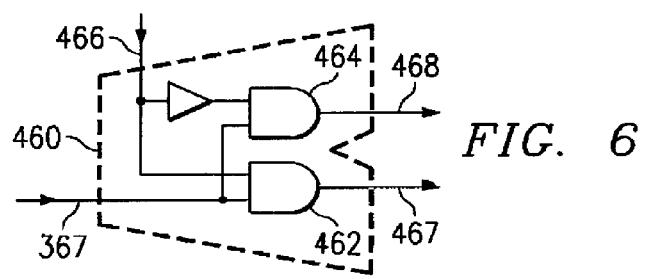

REDUCED COST, HIGH SPEED CIRCUIT TEST ARRANGEMENT

This application is a divisional of application 09/309,544, filed May 11, 1999, now U.S. Pat. No. 6,114,870, which was a divisional of application 08/726,884, filed Oct. 4, 1996, now U.S. Pat. No. 5,907,247.

FIELD OF THE INVENTION

This invention relates to an integrated circuit test arrangement and more particularly to an integrated circuit test arrangement for testing at very high clock rates.

BACKGROUND OF THE INVENTION

During the fabrication of integrated circuit devices, those devices are produced in quantity on a large silicon wafer substrate. Individual integrated circuit devices are sliced from the large silicon wafer. Each resulting individual device is a unique chip with a purpose defined by a device specification. There is a possibility of failure of the individual device to function in accordance with is specification. To identify such devices, a series of tests are run on the device to verify that the device meets its specification. The device under test may be a microprocessor, a memory device, or a module.

Integrated circuit testing today uses testing arrangements and procedures which are very similar to those that were used some fifteen years ago. A large box of electronics, or tester, includes tester logic with drivers and clock edge controllers. Outputs of the drivers are connected through coaxial cables to device sockets mounted on a test board. For testing the integrated circuit devices are inserted into the sockets. Testing several devices at once under control of a single tester saves tester time. This is important because testers each cost some two million dollars.

A typical tester includes a central processing unit which controls several algorithm generators that are electrically inter connected with registers. These registers output data to the devices under control of edge controllers which assure exact timing of data pulses. The central processing unit has full programming capability for running desired tests on the devices. There are sufficient memory, hard disk, monitor, and entry systems for performing tests on several integrated circuits in parallel. The tester drivers are inter connected with level translator through a cable which may be several decimeters long. Such level translators are inter connected with the sockets on the test board through another cable that also may be several decimeters long.

When the tester is operating at 10 MHz, the interconnection cable lengths are not critical. For instance, a coaxial cable that differs in length by approximately three centimeters causes a difference of 100 picoseconds in a time slot of 100 nanoseconds and is negligible or meaningless in regard to most, if not all, testing.

Depending upon the device being tested, the tests may be performed before or after assembly into a package. Some are tested both before and after assembly. The tests are of various types. A power test verifies that the device does not burn up because of a short circuit or other low impedance fault. A functionality test verifies that the device functions in accordance with the device specification. A speed test verifies that the device operates at its specified speed. Also inputs from external sources, timings, and bias voltages are varied to determine whether or not the device tolerates deviations allowed by the device specification.

Currently, existing testers are being adjusted to run tests at higher and higher speeds. Every time the clock speed is increased by more than approximately twenty percent above a prior test speed, a new upgraded tester must be used. This requires a costly, and undesirable replacement investment.

Newly designed devices are operating with a 250 MHz clock and a time slot of four nanoseconds. There is a one nanosecond set up and hold time. The previously mentioned difference in cable length of three centimeters causing the 100 picosecond difference is approximately ten percent of the time slot and is very significant.

In the near future, devices will be operating even faster with a time slot of two nanoseconds. Then the cable length difference will cause a change of twenty to twenty-five percent of the time slot. That much of a change is critical to whether or not the devices can be effectively tested. This is a problem that needs a solution to both the timing issue and the cost of replacement testers.

SUMMARY OF THE INVENTION

These problems and others are resolved by an integrated circuit device test arrangement that includes a plurality of microcomputer. Each of the microcomputers is interconnected directly through a separate test socket to a separate integrated circuit device that is inserted into the test socket. A device tester is coupled to the plurality of microcomputers for transmitting information between the device tester and the plurality of microcomputers. Each microcomputer contains instructions and data for performing a test routine on the associated integrated circuit device and transmitting selected results of the test routine to the tester.

BRIEF DESCRIPTION OF THE DRAWINGS

A better understanding of the invention may be derived by reading the following detailed description of an illustrative embodiment of the invention with reference to the drawings wherein:

FIG. 5 is a block diagram of a clock delay arrangement that can be used in an array of drivers; and FIG. 6 is an example of a demultiplexer circuit that can be used in the clock delay arrangement of FIG. 5.

DETAILED DESCRIPTION

Figure 1:
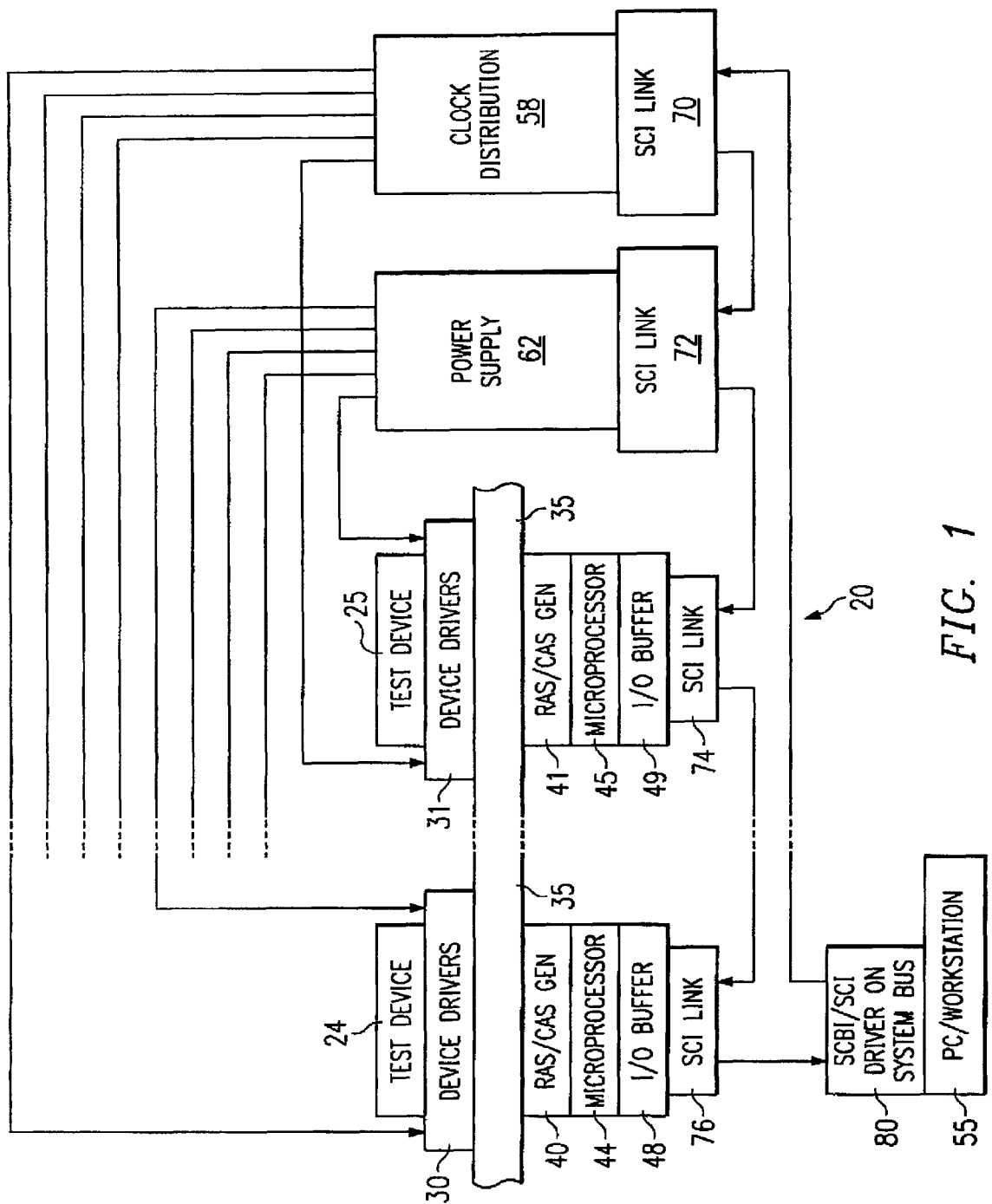
FIG. 1 is a block diagram of an integrated circuit test arrangement.

Referring now to FIG. 1, there is shown an integrated circuit device test arrangement 20 that includes integrated circuit devices 24, 25 which are plugged into or installed respectively in test sockets 30, 31. The test sockets 30, 31 are mounted on one side of a test handler board 35. On the other side of the test handler board 35, there are microcomputer sockets 40, 41 into which are plugged, respectively, microcomputer devices 44, 45 with input/output buffers 48, 49. Appropriate leads of the microcomputers 44, 45 are connected through the respective microcomputer sockets 40, 41, and test sockets 30, 31 to the integrated circuit devices 24, 25. Broken lines are shown between the locations of the microcomputers to indicate that additional microcomputers and integrated circuit devices can be inserted in a series loop arrangement. There is an advantage in that the total number of microcomputers and integrated circuits, to be tested, may be a very large number.

Also shown in FIG. 1 are a personal computer or a workstation 55, a clock distribution block 58, a power supply 62, scalable coherent interface (SCI) links 70, 72, 74, 76, and an SCI driver arrangement 80. The scalable coherent interface link provide fast point-to-point interconnection links among the major components in a serial loop arrangement. The clock distribution block 58 applies clock signals by way of leads 85 to the test sockets 30, 31. Power supply 62 supplies external voltages by way of leads 87 also to the test sockets 30, 31.

Personal computer or workstation 55 includes full central processing capability for controlling all of the test node N1–Nn to perform desired tests on the integrated circuit devices. A central processor controls delivery of algorithm information by way of the scalable coherent interface to each of the microcomputers at the test nodes. The central processor is capable to provide the desired algorithm information. Included are sufficient memory, hard disk capacity, a monitor, and an entry system for controlling the algorithm operation. Appropriate algorithm information is delivered to each microprocessor. That information may be similar for all test node microcomputers when all of the integrated circuit devices, to be tested, are alike. Alternatively, different algorithm information may be delivered to each test node microprocessor if the integrated circuit devices, to be tested, contain different integrated circuits.

The algorithm information transmitted by way of the scalable coherent interface links is in packets, which are dropped off at the test node addressed by each packet. That information is loaded into the microcomputer at that test node for controlling tests on the integrated circuit device installed there. Test algorithms are well known, e.g., a power test for determining existence of any erroneous short circuits or low impedance faults, a functionality test, a speed test, timing and external voltage voltage variation tolerance, and others.

Figure 2:
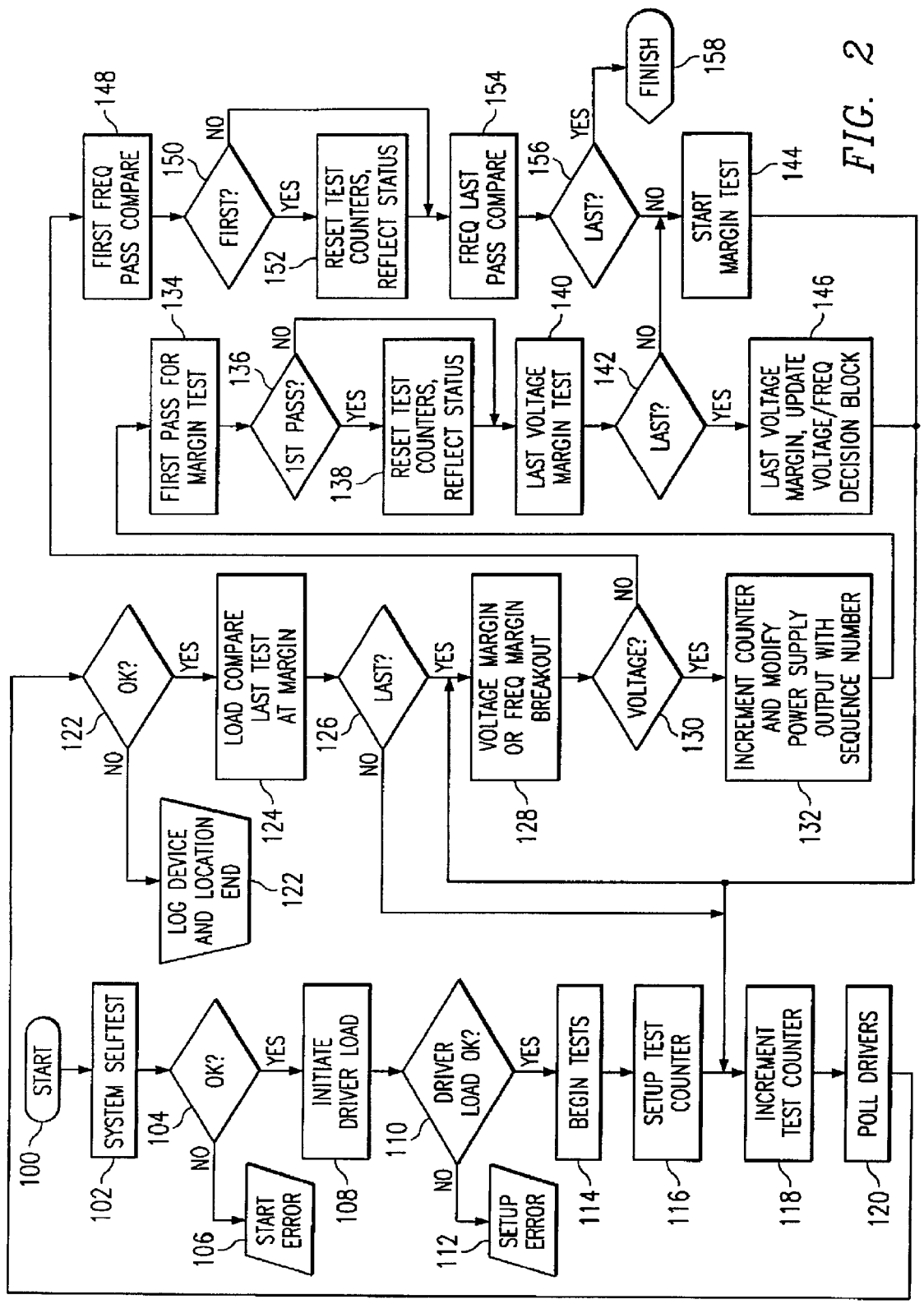
FIG. 2 is a flow chart of a typical testing of an integrated circuit device.

Referring now to FIG. 2, there is presented a flow chart for some typical testing of an integrated circuit device. An operator initiates the test procedure in an oval shaped figure 100 that is labeled START. The system runs a system selftest, as indicated at stop 102. If for any reason the system fails the selftest, the decision stop OK at step 104 decides the result is not okay and a start error is indicated at step 106. Assuming that the selftest result is okay, at step 104, the procedure initiates loading the drivers as indicated in step 108.

A decision is made in relation to the loading of the drivers. If the drivers are not loaded okay, at the decision step 110, a setup error is indicated at step 112. Assuming that the drivers are loaded okay, the procedure begins the tests, as shown in step 114. An initial step in running the test is to set up the test counter in step 116, which for example, may be set to zero. Thereafter the test counter is incremented in the step 118.

Continuing at the top of the next full column, the drivers are polled in step 120. If the drivers are not okay, the associated microprocessor, e.g., microprocessor 44 of FIG. 1, logs identification of the device and of the location of any problem in the step 122. The procedure ends at this spot if there are any problems uncovered while polling the drivers. On the other hand, when the polled drivers all are okay, the procedure loads a compare last test margin step 124.

If the device is being tested in a test that is not the last test at margin in the step 126, the procedure proceeds back to step 118, increments the test counter, and repeats steps 120, 122, 124 and 126. Upon enough iterations through that loop to reach the last test at margin, the procedure determines in the step 126 that the test is the last test at margin and testing proceeds to the step 128. A determination is made whether the test at margin is the voltage margin or the frequency margin. If the microprocessor determines that it is the voltage margin in step 130, in the step 132 counter is incremented and the power supply output voltage is modified in accordance with the changed sequence number in the counter. At this point, the procedure goes to step 134 to determine whether this is the first pass for the margin test. In step 136 if it is the first pass, the test counters are reset, and status is reflected to the microprocessor in step 138.

Thereafter in steps 140 and 142, a determination is made whether this is the last voltage margin test. If it is not the last voltage margin test, the voltage margin test is started again in step 144. The procedure returns to step 118 and loops back through the voltage margin test.

If the procedure is in the last margin test when it steps into the steps 140 and 142, the determination causes the next move into step 146. Then the voltage margin or frequency margin decision block is updated to show that subsequent testing is a frequency margin test. The procedure then returns to step 118 and loops through steps 120, 122, 124, 126, 128, and 130. In steps 128 and 130, it is determined that this is not a voltage margin test. The procedure now goes to step 148 for a first frequency margin pass comparison. If it is the first pass, step 150 determines the procedure goes to the step 152. Test counters are reset, and the status is reflected to the microprocessor. Thereafter the procedure goes to the step 154 for a comparison to determine whether or not this is the last frequency margin pass. In step 156 if it is not the last pass, the procedure goes through step 144 and back to step 118.

At this point the procedure goes back through the frequency margin test with modified conditions enough times to reach the last frequency margin pass. Then in the steps 154 and 156, it is determined that this is the last pass. The test procedure finishes at the stp 158.

Thus the exemplary test procedure controlled by the microprocessor associated with an individual integrated circuit device is completed except for reporting resulting test data to the personal computer or work station 55 in FIG. 1. Such reporting is accomplished through the scalable coherent interface links to be described. The resulting data transmission reporting is accomplished under control of the personal computer or work station 55.

Figure 3:
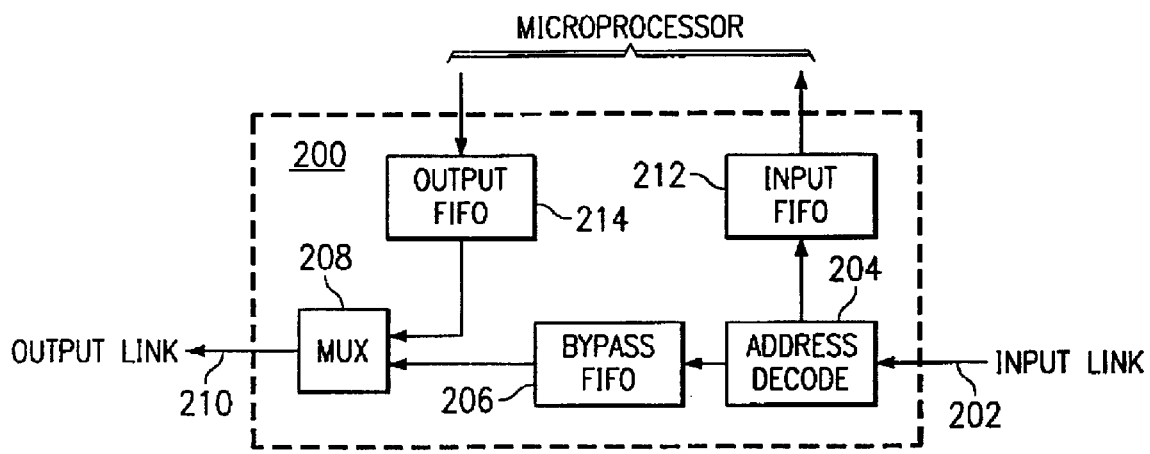
FIG. 3 is a block diagram of a scalable coherent interface node.

Referring now to FIG. 3, there is shown a block diagram of a scalable coherent interface node 200. This type of node is a known standard type of node in accordance with an IEEE Standard, "Scalable Coherent Interface—Logical, Physical and Cache Coherence Specifications, P1596/D1.7, Aug. 5, 1991. Packets of data are formatted in accordance with the specification for transmission around a loop of SCI links. Each packet includes a header containing address information and a body of data. The address information identifies the node on the loop to which the packet is directed. When the packet reaches the addressed node, that packet is loaded into the microprocessor at the node. Information in the packets addressed for any one node include program instructions and data needed for running the test procedure to be accomplished on the integrated circuit device located at that node.

The packets are received at the node 200 on the input link 202. Address information in the header is decoded by an address decoder 204. If the address is different than the address of the receiving node, the entire packet proceeds through a bypass first in, first out register 206, a multiplexer 208 and an output link 210 to the next node along the loop. If the address in the received packet is decoded by the address decoder 204 into the receiving node address, the packet is transmitted through an input first in first out register 212 to the microcomputer connected to the receiving node. Data packets thus directed to the microcomputer connected to the node provide the program and data needed for operating tests under control of that microcomputer.

Once the test procedure is completed, the test results stored in the microcomputer are formatted into the scalable coherent interface packets and are transmitted back to the SCI by way of an output first in, first out register 214. The multiplexer 208 passes these result packets to the output link 210 and on to the next node along the SCI loop.

In accordance with the foregoing description of the operation of one SCI node, each node on the SCI loop receives sufficient program and data information for the microcomputer at that node to control the desired test procedures on the integrated circuit device to be tested at that node. Once the program and data information are received by al of the nodes that are to run test, those tests can be run concurrently on devices at the several nodes. Because there is no loss of information while it traverses the SCI loop, many nodes can be connected. Thus a very large number of integrated circuit devices can be tested simultaneously. Each microcomputer needs to be loaded only once for as long as the same type of integrated circuit device is to be tested at that node.

Figure 4:
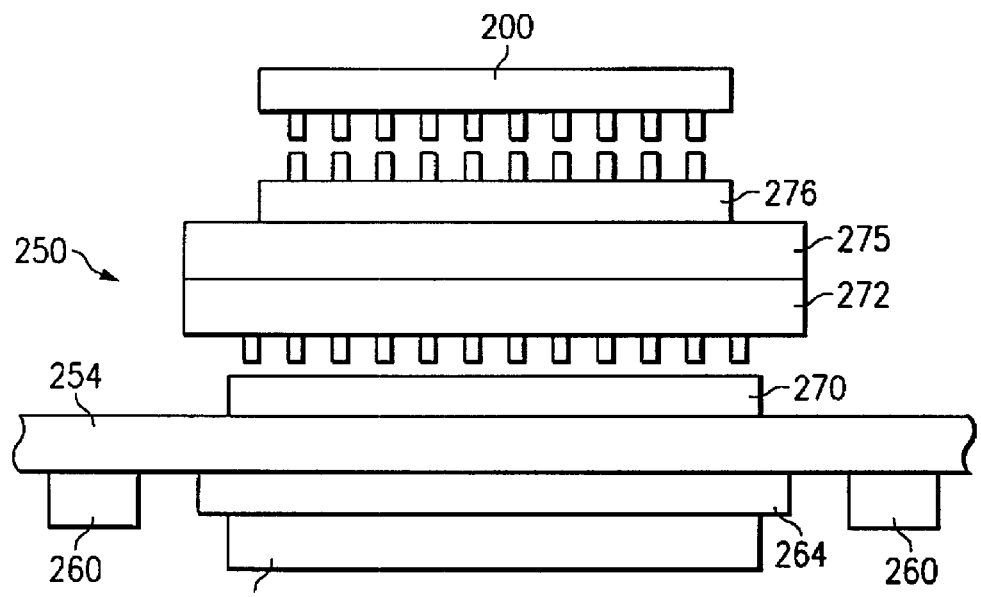
FIG. 4 is a partially exploded cross-sectional view of the physical arrangement for an exemplary node.

Referring now to FIG. 4, there is shown a partially exploded cross-sectional view of the physical arrangement for an exemplary node 250. A test handler board backplane 254 has a microprocessor 258, with input/output buffers, mounted on one side. External input/output registers 260 also are mounted on the same side of the backplane 254. These input-output registers are interconnected with the microprocessor 258 and with the input first in, first out register 212 and the output first in, first out register 214 of the SCI node circuit of FIG. 3. A microprocessor socket 264 is mounted on the backplane 254 for receiving the leads from the microprocessor 258.

On the other side of the backplane 254, there is mounted a low speed interface connector 270. A test socket 272 is inserted into the connector 270. The test socket 272 includes interface, setup buffer and control circuits 275. There also is a group of driver circuits 276 each for applying a signal to a different input lead of the integrated circuit 280, to be tested.

Very short leads of relatively uniform length are used to connect all external connections of the microprocessor 258 through the microprocessor socket 264, the backplane 254, the connector 270, the test socket 272, and the buffer and control circuits to the external connections of the integrated circuit device 280. These leads are typically less than or equal in length to approximately two centimeters. They may be less than or equal to approximately one centimeter.

Such short interconnections between each microcomputer and it's integrated circuit device to be tested allow very high speed tests to be run. There is much less delay time than is encountered in operating prior art test arrangements that have long cable runs between the tester and the test handler and between the test handler and the test sockets.

Advantageously each microcomputer produces and transmits to the integrated circuit device being tested, signals with edges that are switch in times of approximately 300 picoseconds down to approximately 50 picoseconds in today's technology. Clock signal edges have a time tolerance within approximately plus or minus 100 picoseconds and may go as low as within approximately plus or minus one picosecond.

The foregoing tolerances are dependent upon technology chosen for circuitry. Galliun arsenide devices can provide a very fast switching time. Bipolar transistor devices can provide a fast switching time. Complementary metal-oxide-semiconductor devices provide the slower switching time. Slower clock edges can be achieved by gate delay devices. Very fast edges are achieved by delay lock loop arrangements.

There is a wide flexibility in the circuit arrangements and the test operations that can be used. For example, each device to be tested concurrently can be a different type of device. The test programs can be customized for each node of the SCI loop. Voltages and clock frequencies can be customized for each node.

Referring now to FIG. 5, there is shown a clock delay arrangement 300 which can be used in the array of drivers.

The microprocessors 44 and 45 are arranged to supply a group of data bits representing delay data for signals they send to the test devices. This delay data is specifically determined with respect to each of the transmitted signals so that each signal concurs in arrival time, at the test devices, with arrival of other signals after transmission over leads of fixed but different lengths. This delay data is loaded into circuit 401 of FIG. 5. Once the delay data is loaded into circuit 401, it remains stored therein as long as the microprocessor 44 is energized or until the test device lead configuration is changed. The delay data determines the delay times imparted to various signals during all operations of the microprocessor 44 of FIG. 1. A description of how the delay times are imparted to the various signals is presented subsequently with respect to FIGS. 5 and 6.

Referring now to FIG. 5, there is shown a signal delay circuit 401 is arranged to produce a group of signals on a group of leads 389 in response to a signal applied on a lead 398 from the microprocessor 40 of FIG. 1 and clock signals on the clock lead 376. Delay data, from the data bus 328, is stored into a delay register and selector 406, in response to a code load signal on a lead 408, as transmitted through a code load driver 409 and a lead 397 to the delay register and selector 406.

The signal on the lead 398 is a high logic level that causes the enable driver 404 to apply the signal over a lead 405 to several delay circuit arrangements 410–417. Each of the delay circuit arrangements 410–417 is the same as the others so only the circuit 410 is shown in detail. The signal on the lead 405 causes the delay register and selector 406 to output a one-out-of-eight bit code word for exemplary purposes, assume that this code word has a single "1" in the left most bit position and all "0s" in the other bit positions. The clock signal on the lead 407 is applied to the signal input of a demultiplexer 420 in a series of demultiplexers 420–427. The input of each demultiplexer is directed to the upper output in response to a control "0" and to the lower output in response to a control "1".

Since a "1" is applied to the left most demultiplexer control terminal, the clock signal is directed to the lead 428 and OR gate 429. The output of the OR gate 429 is a write enable signal on one of the control leads 89. This clock signal traverses the delay circuit arrangement 410 by passing through only a single demultiplexer 420 which imparts a single increment of delay. All of the signals generated by the delay circuits 410–417 may be generated the same way, so that they all have a single increment of delay imparted and therefor occur concurrently. Alternatively those signals all may have different delays imparted or some the same and some different.

The signals on the leads 389 are generated at different times depending upon the lengths of the specific leads 328 and 389 between the microprocessor 44 and the test device of FIG. 1. Signal delays are measured and assigned suitable one-out-of-eight bit codes for imparting a desired number of increments of delay into transmitted signals so that they arrive at the test device concurrently with other arriving signals.

When the microprocessor 44 of FIG. 1 is being setup, the appropriate delay code is applied to each delay register and selector, such as register and selector 406 of FIG. 5. This data remains stored therein as long as the microprocessor 44 is energized if volatile memory devices are utilized. If non-volatile memory devices are used, then the data remains even after energization is terminated. Every time the enable signal, is applied through the enable circuit 404, the signal on lead 407 is delayed according to the number of demultiplexers 420–427 that the clock signal traverses along its path to the OR gate 429. For instance if the single "1" in the delay code word is stored in the fourth bit position from the left in the register and selector 406, the signal traverses four demultiplexers 420, 421, 422 and 423 and a lead 430 to the OR gate 429. The four demultiplexers impart four increments of delay time into the clock signal. The signal generated by this clock signal at the output of the OR gate 429 has four increments of delay time imparted into it. As a result signals, generated by the delay circuits 411–417, have their selected different increments of delay imparted.

Thus the signal delay circuit 401 produces variously delayed signals on the group of leads 389. The circuit 401 selects whether a uniform delay code word controls the demultiplexers 420–427 of all delay arrangements or different specific delay code words are applied to the demultiplexers of each delay arrangement 401–417.

Referring now to FIG. 6, there is shown an exemplary demultiplexer circuit 160. This demultiplexer circuit 460 may be used in the delay circuit arrangement of both FIG. 5. In FIG. 6, a clock signal, on the clock lead 367, is applied to an input terminal of each of two AND gates 462 and 464. A control lead 466 from a delay data register such as the delay register 406 of FIG. 5, carries one of the bits from the delay data register to another input of the AND gate 462. A complement of the bit from the delay data register is applied to the second input of the AND gate 464.

In operation, a clock signal is directed alternatively to one or the other of the AND gate outputs on leads 467 or 468, depending upon the state of the bit applied on the control lead 466. When a logic "1" is applied, the system clock signal is directed out onto the lead 467. A logic "0", on the control lead 466, directs the system clock signal out on the lead 468.

A finite increment of delay time, or unit of delay time, is used while the clock signal traverses the demultiplexer 460. Such an increment of delay time is one of the increments of delay time imparted to the clock signals which traverse the delay circuit arrangements of FIG. 5. In those illustrative delay circuit arrangements, up to eight increments of delay time may be imparted to the clock signal, in response to specific delay data stored in the associated delay data register. In actual circuit implementations of the delay circuit arrangements of FIG. 5, it is obvious that additional demultiplexers and code bits may be used to provide additional increments of delay time.

The forgoing describes an illustrative embodiment of an integrated circuit test arrangement, in accordance with the invention. The described arrangement together with those made obvious in view thereof are considered to be covered by the appended claims.

What is claimed is:

1. A system comprising:
   a control computer arranged to produce test algorithm information;
   a plurality of integrated circuits for executing the test algorithm information to generate test signals;
   a serial loop for serially communicating data packets from the control computer to the plurality of integrated circuits, wherein the data packets each include an address portion corresponding to at least one of the integrated circuits and a data portion including the test algorithm information; and
   a plurality of sockets, each coupled to a respective one of the plurality of integrated circuits, and each for receiving a respective circuit to be operated so that test signals generated by the corresponding integrated circuit according to the test algorithm information are communicated to the received circuit.

2. A system as in claim 1, wherein the serial loop communicates data packets according to a scalable coherent interface standard.

3. A system as in claim 1, wherein the test signals are arranged to vary an operating frequency of said respective plurality of circuits to be operated.

4. A system as in claim 1, wherein the plurality of circuits to be operated comprise different types of circuits.

5. A system as in claim 1, wherein each integrated circuit of said plurality of integrated circuits comprises a delay circuit, the delay circuit arranged to delay a respective plurality of signals by respective predetermined times, such that the signals are applied to each respective circuit of said circuits to be operated at substantially the same time.

6. A system as in claim 1, wherein each integrated circuit of said plurality of integrated circuits comprises a processor and a memory circuit.

7. A system as in claim 6, wherein the processor is arranged to apply a sequence of signals to each circuit of said circuits to be operated and receive a corresponding sequence of data signals from said each circuit.

8. A system as in claim 1, comprising a power supply circuit coupled to the control computer, the power supply circuit arranged to apply power to the plurality of sockets in response to control signals from the control computer.

9. A system as in claim 1, wherein each of the circuits to be operated are memory circuits, and wherein each of the plurality of integrated circuits produces row and column address signals at a respective socket of the plurality of sockets.

10. A system comprising:
    a control computer for generating test algorithm information including instructions and data;
    a plurality of microprocessors, each capable of executing test algorithm information received from the control computer;
    a serial bus, serially coupling the control computer and the plurality of microprocessors, for communicating data packets from the control computer to the plurality of microprocessors, wherein the data packets each include an address portion corresponding to at least one of the microprocessors and a data portion including the test algorithm information; and a plurality of sockets, each for receiving a circuit to be tested, and each coupled to a corresponding one of the plurality of microprocessors, for communicating test signals generated by the corresponding microprocessor according to the test algorithm information, to the circuit to be tested.

11. A system as in claim 10, wherein the serial bus communicates data packets according to a scalable coherent interface standard.

12. A system as in claim 10, wherein the test signals are arranged to vary an operating frequency of the plurality of circuits to be tested.

13. A system as in claim 10, further comprising a delay circuit associated with each microprocessor, the delay circuit arranged to delay a respective plurality of test signals by respective predetermined times, such that the test signals are applied to each circuit to be operated at substantially the same time.

14. A system as in claim 10, wherein the plurality of circuits to be operated comprise different types of circuits.

15. A system as in claim 10, further comprising a memory circuit associated with each of the microprocessors.

16. A system as in claim 15, wherein each microprocessor is arranged to apply a sequence of test signals to its circuit to be operated and receive a corresponding sequence of data signals from said circuit.

17. A system as in claim 10, further comprising a power supply circuit coupled to the control computer, the power supply circuit arranged to apply power to the plurality of sockets in response to control signals from the control computer.

18. A system as in claim 10, further comprising a clock circuit coupled to the control computer, the clock circuit arranged to apply clock signals to the plurality of sockets in response to control signals from the control computer.

* * * * *